(12) United States Patent
Lin et al.

(10) Patent No.: US 11,497,115 B2
(45) Date of Patent: Nov. 8, 2022

(54) CARRIER BOARD STRUCTURE WITH AN INCREASED CORE-LAYER TRACE AREA AND METHOD FOR MANUFACTURING SAME

(71) Applicant: UNIMICRON TECHNOLOGY CORPORATION, Taoyuan (TW)

(72) Inventors: Yi Lin, Taipei (TW); Hsiao-Han Huang, Taipei (TW); Yu-Hsin Pan, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/944,178

(22) Filed: Jul. 31, 2020

(65) Prior Publication Data

US 2021/0378092 A1 Dec. 2, 2021

(30) Foreign Application Priority Data

May 28, 2020 (TW) .................................. 109117858

(51) Int. Cl.
  *H05K 1/02* (2006.01)
  *H05K 1/11* (2006.01)
  (Continued)
(52) U.S. Cl.
  CPC ........... *H05K 1/0296* (2013.01); *H05K 1/115* (2013.01); *H05K 3/10* (2013.01); *H05K 3/4038* (2013.01);
  (Continued)

(58) Field of Classification Search
  CPC ...... H05K 1/0296; H05K 3/10; H05K 3/4038; H05K 1/115; H05K 2201/09509
  See application file for complete search history.

(56) References Cited

U.S. PATENT DOCUMENTS

2006/0065434 A1* 3/2006 Hsu ...................... H05K 3/4602
  174/255
2008/0314632 A1* 12/2008 Wu ....................... H05K 3/4602
  174/263

(Continued)

FOREIGN PATENT DOCUMENTS

TW        I418265 B     12/2013
TW        I545997 B     8/2016

*Primary Examiner* — Ishwarbhai B Patel
(74) *Attorney, Agent, or Firm* — JCIPRNET

(57) ABSTRACT

Carrier board structure with an increased core-layer trace area and method for manufacturing the same are introduced. The carrier board structure comprises a core layer structure, a first circuit build-up structure, and a second circuit build-up structure. The core layer structure comprises a core layer, a signal transmission portion, and an embedded circuit layer, wherein the signal transmission portion and the embedded circuit layer are disposed inside the core layer and electrically connected. The first circuit build-up structure is disposed on the core layer on a same side as the embedded circuit layer and is electrically connected to the embedded circuit layer. The second circuit build-up structure is disposed on the core layer on a same side as the signal transmission portion, and is electrically connected to the first circuit build-up structure through the signal transmission portion and the embedded circuit layer.

5 Claims, 5 Drawing Sheets

(51) Int. Cl.
*H05K 3/40* (2006.01)
*H05K 3/10* (2006.01)

(52) U.S. Cl.
CPC ...... *H05K 1/11* (2013.01); *H05K 2201/09509* (2013.01)

(56) References Cited

U.S. PATENT DOCUMENTS

| | | | | |
|---|---|---|---|---|
| 2010/0006324 | A1* | 1/2010 | Kitamura | C08K 3/013 174/255 |
| 2014/0098506 | A1* | 4/2014 | Mallik | H05K 3/4605 361/767 |
| 2016/0113114 | A1* | 4/2016 | Chan | H05K 3/4015 174/251 |
| 2016/0165723 | A1* | 6/2016 | Romero | H01L 23/49822 257/774 |
| 2018/0168039 | A1* | 6/2018 | Numagi | H01L 23/49838 |
| 2020/0176405 | A1* | 6/2020 | Wu | H01L 23/293 |
| 2020/0388600 | A1* | 12/2020 | Huang | H01L 23/562 |

* cited by examiner

CARRIER BOARD STRUCTURE WITH AN INCREASED CORE-LAYER TRACE AREA AND METHOD FOR MANUFACTURING SAME

CROSS-REFERENCE TO RELATED APPLICATION

This non-provisional application claims priority under 35 U.S.C. § 119(a) on Patent Application No(s). 109117858 filed in Taiwan, R.O.C. on May 28, 2020, the entire contents of which are hereby incorporated by reference.

BACKGROUND OF THE INVENTION

1. Field of the Invention

The present disclosure relates to a structure of a core layer applied to a circuit board, and in particular to a carrier board structure with an increased core-layer trace area and a method for manufacturing the same.

2. Description of the Related Art

With the rapid development of the electronics industry, many applications such as related electronic products and processors in different fields, such as the Internet of Things (Internet of Things, IoT), 5G, biotechnology, artificial intelligence chip (Artificial intelligence Chip, AI chip) and other fields, have grown rapidly.

Currently, related electronic components or processors inside an electronic product are disposed on a carrier board structure, and the carrier board structure is disposed on a printed circuit board (PCB), and then packaging is performed, so as to complete the manufacturing of the electronic product or processor. The carrier board structure includes a core layer, which is internally provided with a plurality of copper block structures, and corresponding circuit build-up structures are disposed on upper and lower surfaces of the core layer, and the circuit build-up structures are electrically connected through the copper block structures. The circuit build-up structure on the lower surface of the core layer is electrically connected to a corresponding circuit board; and the circuit build-up structure on the upper surface of the core layer is electrically connected to the electronic components. Finally, packaging is performed to complete the packaging of related electronic products and processors.

In order for the carrier board structure to effectively carry and to be electrically connected to related electronic components, the circuit layout of the carrier board structure needs to match the circuit structure of the related electronic components, and accordingly the wiring layout of the carrier board structure is divided into two parts, wherein one part is the layer number design of the circuit build-up structure, and another part is the area size of the pads of the circuit in the circuit build-up structure for being connected to the copper block structures. Generally speaking, when the circuit structure of electronic components is more complex, the layer number of the circuit build-up structure needs to be increased accordingly. In order to match with the connection of complex circuits, the area of the pads of some circuits also needs to be expanded accordingly so as to connect the corresponding number and positions of the circuits disposed on the same side, so that the signals of electronic components are aggregated through the circuit build-up structure disposed on the upper surface of the core layer, and then transferred to the circuit build-up structure on the lower surface of the core layer through the copper block structures, and transferred to the circuit board. However, the carrier board structure is a fixed size, and the upper and lower surfaces are also fixed areas. As the circuit layout becomes more complicated, not only the layer number of circuit build-up structures needs to be increased in order to lay out more circuits, but also, as the circuit increases, it is necessary to expand the area of the contacts (or pads) in order to connect more lines on the same side. As a result, the volume of the carrier board structure becomes larger, which is not conducive to subsequent packaging, makes the electronic product limited to the internal space, and causes difficulties in assembly, and in order to expand the contact area of some circuits, difficulty in circuit layout is also increased.

BRIEF SUMMARY OF THE INVENTION

In view of the problems in the prior art, an objective of the present disclosure is to provide a carrier board structure with an increased core-layer trace area and a method for manufacturing the same. By providing an embedded circuit layout inside the core layer to provide a double-sided circuit layout, it not only enhances the circuit layout flexibility, but also reduces the volume of the entire carrier board structure, so as to achieve space utilization enhancement and circuit layout flexibility.

In order to achieve the above objectives, a carrier board structure with an increased core-layer trace area is provided. The carrier board structure comprises a core layer structure, a first circuit build-up structure, and a second circuit build-up structure. The core layer structure includes a core layer, a signal transmission portion, and an embedded circuit layer. The core layer has a first side and a second side opposite to each other. The signal transmission portion is disposed inside the first side of the core layer and partially exposed on the first side of the core layer. The embedded circuit layer is disposed inside the second side of the core layer and is electrically connected to the signal transmission portion inside the core layer. The embedded circuit layer is partially exposed on the second side of the core layer. The first circuit build-up structure is disposed on the second side of the core layer and electrically connected to the embedded circuit layer. The second circuit build-up structure is disposed on the first side of the core layer, and electrically connected to the first circuit build-up structure through the signal transmission portion and the embedded circuit layer.

As can be observed from the above structure, double-sided circuit connection can be provided by additionally disposing the embedded circuit layer inside the core layer and making the embedded circuit layer electrically connected to the first circuit build-up structure, inside the core layer. In this way, the difficulty in circuit layout in a conventional circuit build-up structure is resolved. The conventional circuit build-up structure can only provide single-sided circuit connection on the same side, which leads to the difficulty in the circuit layout due to the need to expand the area of some circuit contacts of the circuit build-up structure. Since the provision of the double-sided circuit layout can effectively reduce the layer number of the first circuit build-up structure, thereby not only improving the flexibility of circuit layout, but also reducing the volume of the circuit build-up structure. It can also solve the problem of the need to expand the area of some circuit contacts, thereby achieving the purposes of improving space utilization and circuit layout flexibility.

In order to achieve the above objectives, a method for manufacturing a carrier board structure with an increased core-layer trace area is provided. The method comprises the following steps. A signal transmission portion is formed inside a first side of a core layer so that the signal transmission portion is partially exposed on the first side of the core layer. An embedded circuit layer is formed inside a second side of the core layer so that the embedded circuit layer is electrically connected to the signal transmission portion inside the core layer and is partially exposed on the second side of the core layer. A first circuit build-up structure is formed on an outer surface of the second side of the core layer so that the first circuit build-up structure is electrically connected to the embedded circuit layer. A second circuit build-up structure is formed on an outer surface of the first side of the core layer so that the second circuit build-up structure is electrically connected to the first circuit build-up structure through the signal transmission portion and the embedded circuit layer.

As can be observed from the above method, double-sided circuit connection can be provided by additionally disposing the embedded circuit layer inside the core layer and making the embedded circuit layer electrically connected, inside the core layer, to the first circuit build-up structure disposed outside the core layer. In this way, the difficulty in circuit layout in a conventional circuit build-up structure can be resolved, wherein the conventional circuit build-up structure can only provide single-sided circuit connection on the same side, which leads to the difficulty in the circuit layout due to the need to expand the area of some circuit contacts of the circuit build-up structure. The provision of the double-sided circuit layout can effectively reduce the layer number of the first circuit build-up structure, thereby not only improving the flexibility of circuit layout, but also reducing the volume of the circuit build-up structure. It can also solve the problem of the need to expand the area of some circuit contacts, thereby achieving the purposes of improving space utilization and circuit layout flexibility.

DETAILED DESCRIPTION OF THE INVENTION

Figure 1:
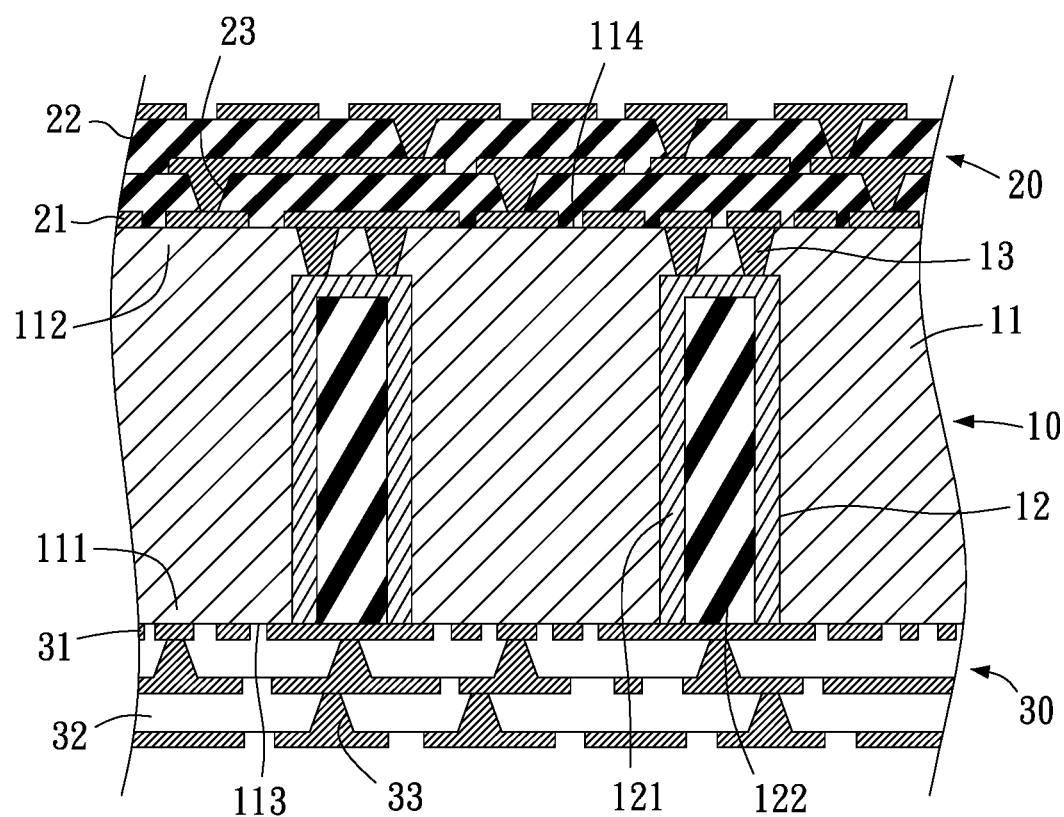
FIG. 1 is a partial cross-sectional schematic view of a preferred embodiment of a carrier board structure of the present disclosure.

The drawings shown according to the present disclosure are partial cross-sectional views of the carrier board structure. The number and size of the relevant structures presented in the drawings are for reference only, not to limit the specific structure of the carrier board structure according to the present disclosure. In addition, the directional relationship described in the specification according to the present disclosure is based on the directions shown in the drawings for the sake of illustration, and the present disclosure is not limited thereto.

Refer to FIG. 1, which illustrates a preferred embodiment of a carrier board structure with an increased core-layer trace area according to the present disclosure. The carrier board structure comprises a core layer structure 10, a first circuit build-up structure 20, and a second circuit build-up structure 30, wherein the core layer structure 10 comprises a core layer 11, an embedded circuit layer 13, and a signal transmission portion 12. The core layer 11 has a first side 111 and a second side 112 opposite to each other; the first side 111 of the core layer 11 has an outer surface 113; the second side 112 of the core layer 11 has an outer surface 114. The first circuit build-up structure 20 is disposed on the outer surface 114 of the second side 112 of the core layer structure 10. The second circuit build-up structure 30 is disposed on the outer surface 113 of the first side 111 of the core layer structure 10, and the second circuit build-up structure 30 is electrically connected to the first circuit build-up structure 20 through the core layer structure 10.

Figure 2:
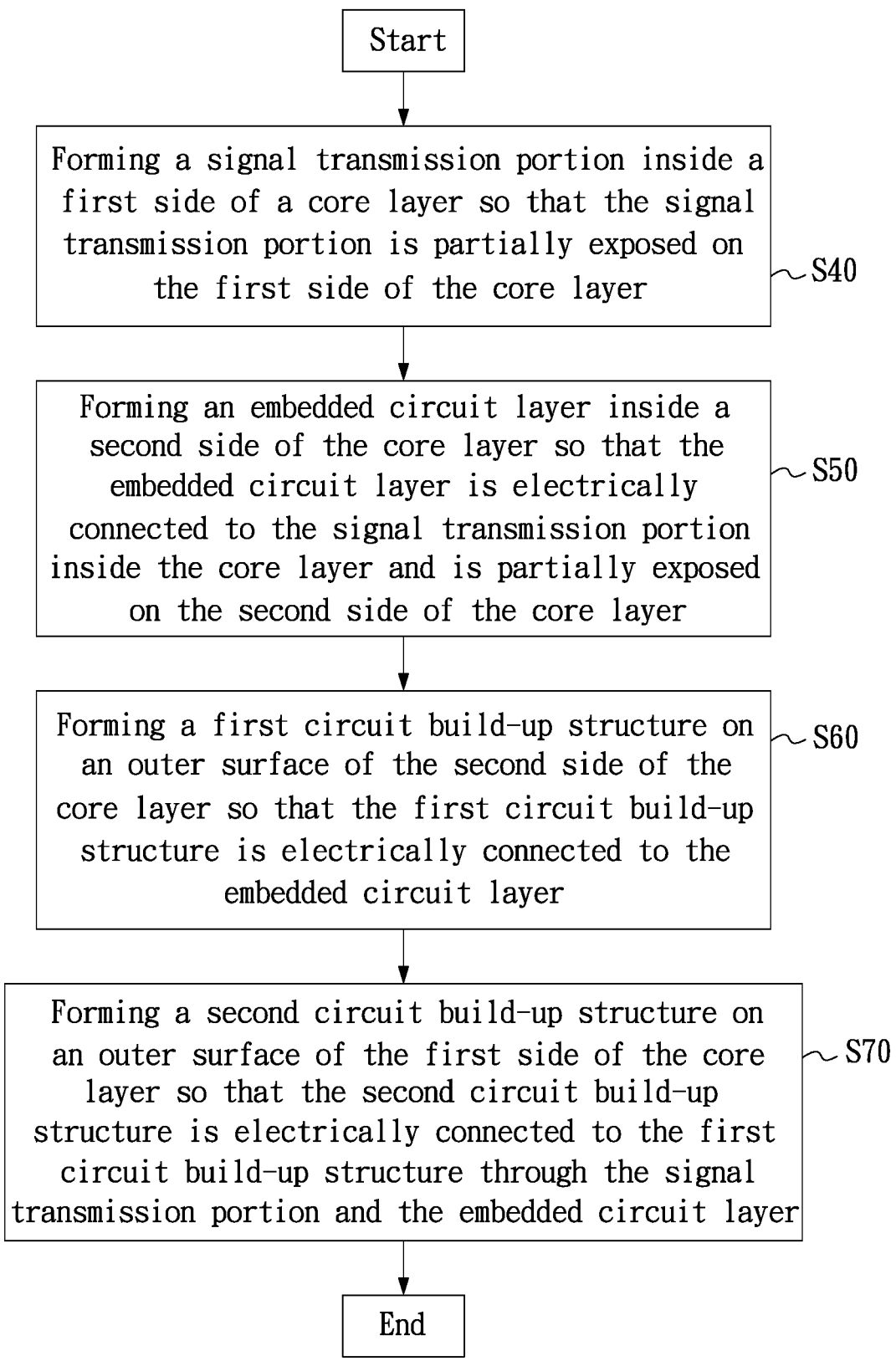
FIG. 2 is a schematic flow chart of a preferred embodiment of the manufacturing method of the carrier board structure of the present disclosure.

In order to illustrate the specific structure of the carrier board structure and a corresponding manufacturing method according to the present disclosure, referring to FIG. 2, the manufacturing method of the carrier board structure with an increased core-layer trace area is shown in a flowchart. The relative relationship, disposition manners, and connection relationship of the related structures will be illustrated by way of illustrating the manufacturing process of the carrier board structure.

Figure 3:
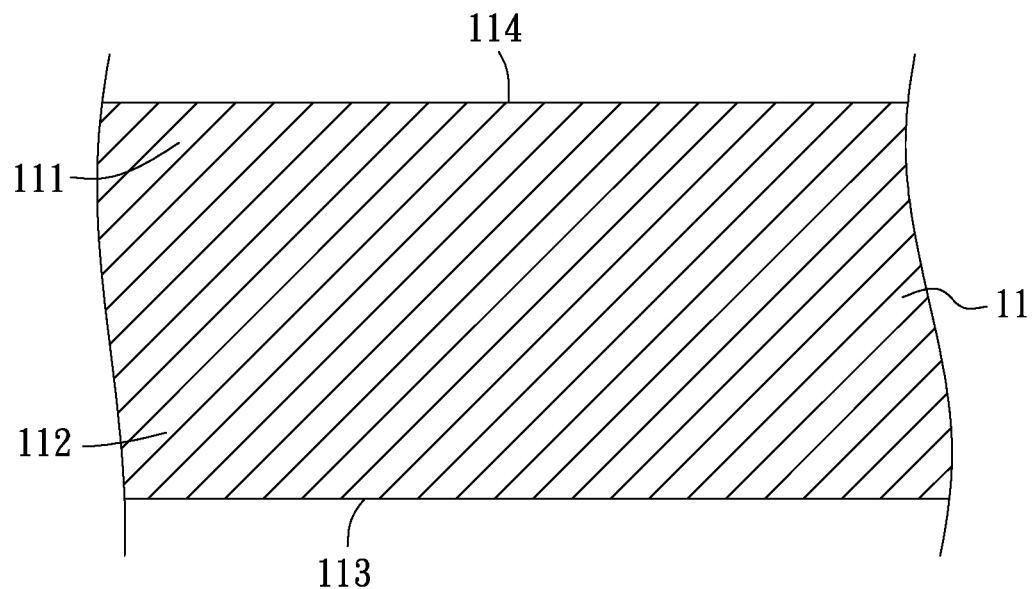
FIG. 3 is a first structural schematic view of the manufacturing process of the core layer structure of the carrier board structure of the present disclosure as shown in FIG. 1.

Referring to FIGS. 1 to 3, a specific manufacturing of the core layer structure 10 is illustrated. Firstly, as shown in step S40, the signal transmission portion 12 is formed inside a first side of the core layer 11 so that the embedded circuit layer 13 is partially exposed on the first side 111 of the core layer 11. As shown in step S50, a signal transmission portion is formed inside the first side of the core layer 11 so that the signal transmission portion is electrically connected to the embedded circuit layer inside the core layer, and is partially exposed on the second side of the core layer.

Figure 4:
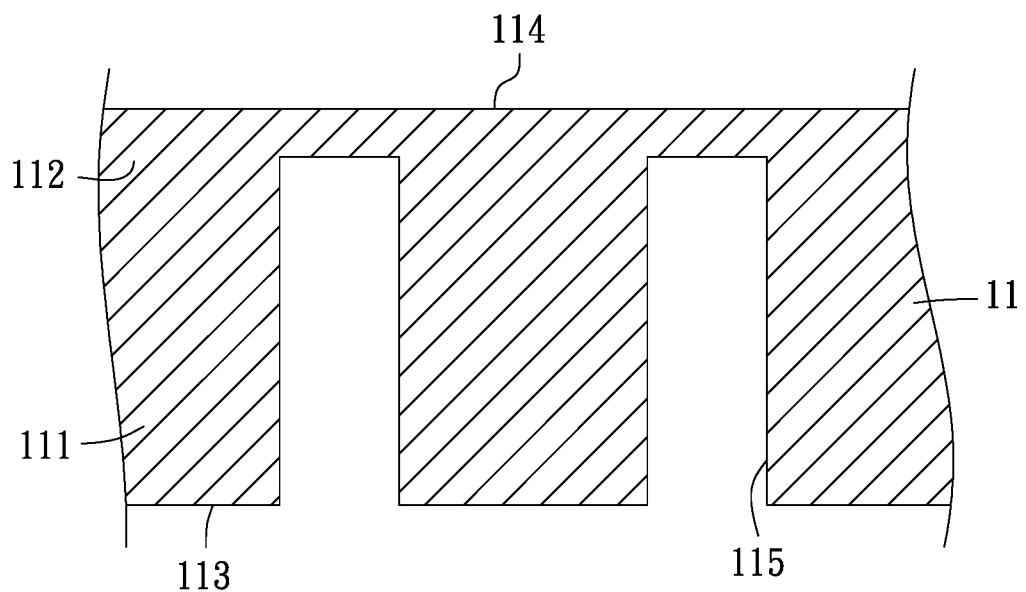
FIG. 4 is a schematic structural view for the manufacturing process of the core layer structure of the carrier board structure of the present disclosure as shown in FIG. 3.

Referring to FIGS. 1 to 3, the core layer 11 can be provided firstly. In an embodiment, the core layer 11 may have organic polymer insulating materials, etc., and include glass fibers or glass beads. Referring to FIGS. 1, 2, 4, in order to dispose the signal transmission portion 12, a mechanical drilling method is first employed to make a plurality of mechanically drilled holes 115 having a specific depth in the first side 111 of the core layer 11 (which are illustrated in the lower part of the core layer 11 shown in FIG. 3), wherein the mechanically drilled holes 115 have not gone through the first side 111 and second side 112 of the core layer 11, and then the signal transmission portion 12 is disposed in the mechanically drilled holes 115, so that the signal transmission portion 12 is disposed inside the first side 111 of the core layer 11.

Figure 5A:
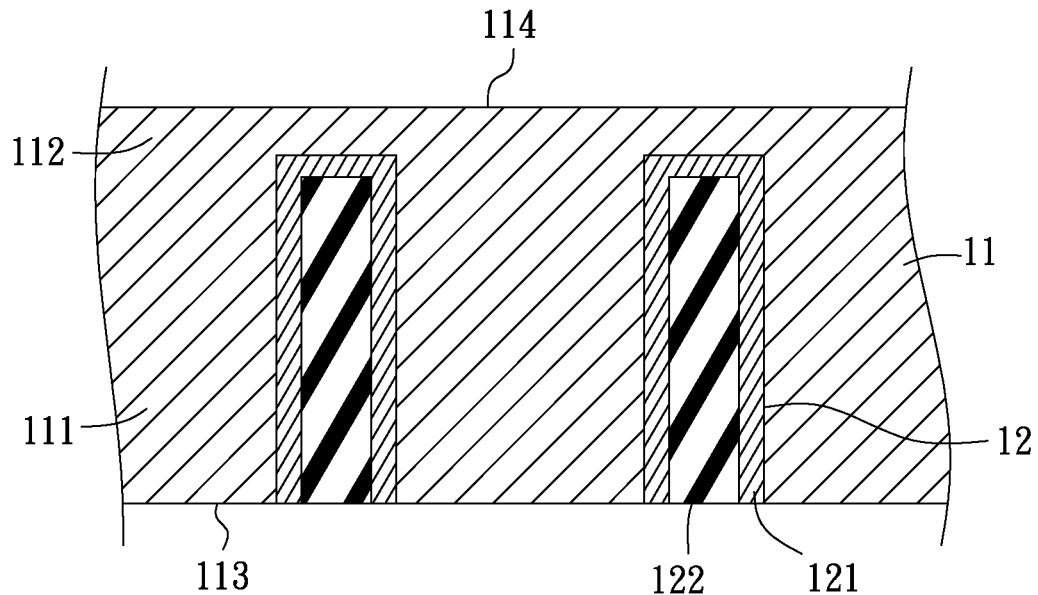
FIG. 5A is a schematic diagram of a first structure of the signal transmission portion of the core layer structure of the carrier board structure of the present disclosure as shown in FIG. 4.

In the embodiment, the signal transmission portion 12 can be implemented in various structures. Referring to FIG. 5A, a first exemplary structure of the signal transmission portion 12 is illustrated. The first exemplary structure of the signal transmission portion 12 comprises a plurality of conductive members 121 and a plurality of insulation fillers 122. Regarding manufacturing, an electroplating method is employed to form a conductive member 121 on an inner wall of each of the mechanically drilled holes 115 (if necessary, the excess part of the conductive member 121 can be removed by dry etching or wet etching, etc.). A corresponding insulation filler 122 is then formed in a space surrounded by the corresponding conductive members 121 in each of the mechanically drilled holes 115 so as to fill the space surrounded by the corresponding conductive member 121 with the corresponding insulation filler 122. As a result, the corresponding mechanically drilled hole 115 is completely filled with the corresponding conductive member 121 and the insulation filler 122. The conductive members 121 are partially exposed on an outer surface 113 of the first side 111 of the core layer 11, and the insulation fillers 122 are partially exposed on the outer surface 113 of the first side 111 of the core layer 11, wherein the conductive member 121 may have a conductive metal material, such as a copper material and the insulation filler 122 may have a dielectric insulation material, such as a via-filling ink material, an organic polymer insulation material, etc. Since the insulating filler 122 is a dielectric insulation material, it has the characteristics of light weight. Employing the first exemplary structure of the signal transmission portion 12 can facilitate the carrier board structure according to the present disclosure with the characteristics of light weight.

Figure 5B:
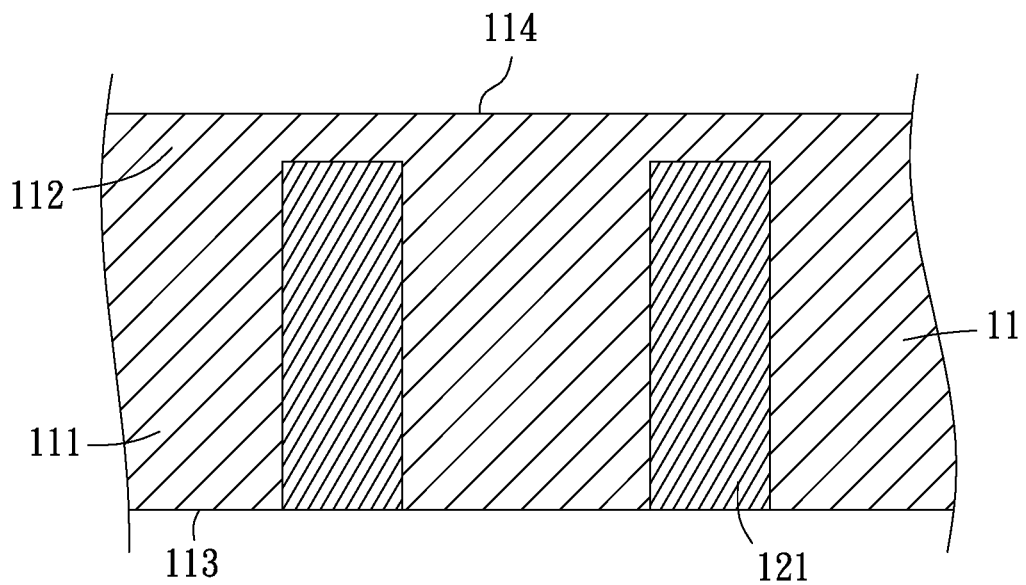
FIG. 5B is a schematic diagram of a second structure of the signal transmission portion of the core layer structure of the carrier board structure of the present disclosure as shown in FIG. 4.

Referring to FIG. 5B, a second exemplary structure of the signal transmission portion 12 is illustrated. The second exemplary structure of the signal transmission portion 12 differs from the first exemplary structure of the signal transmission portion 12 in that the second exemplary structure of the signal transmission portion 12 is not provided with an insulation filler 122, but is formed by completely filling the mechanically drilled holes 115 with the corresponding conductive members 121. In addition, the conductive members 121 are partially exposed on the outer surface 113 of the first side 111 of the core layer 11, wherein the conductive member 121 may have a conductive metal material, such as a copper material. Because the mechanically drilled holes 115 are filled with the corresponding conductive members 121, a carrier board structure employing the second exemplary structure of the signal transmission portion 12 has a weight greater than that of a carrier board structure employing the first exemplary structure of the signal transmission portion 12. Nevertheless, the second exemplary structure of the signal transmission portion 12 can be employed by completely filling the corresponding mechanically drilled holes 11 with a metal material, so that the mechanically drilled holes 11 have the effects of good electrical conductivity and a large signal transmission path, thus facilitating efficiency enhancement of a carrier board structure employing the second exemplary structure of the signal transmission portion 12.

It should be noted that the signal transmission portion 12 shown in a portion of the drawings according to the present disclosure is exemplified by the second exemplary structure as illustrated in FIG. 5B for the sake of illustration, but the present disclosure is not limited to the above examples. In practical implementation, the first or second exemplary structure of the signal transmission portion 12 can be selected according to actual design requirements.

Figure 6:
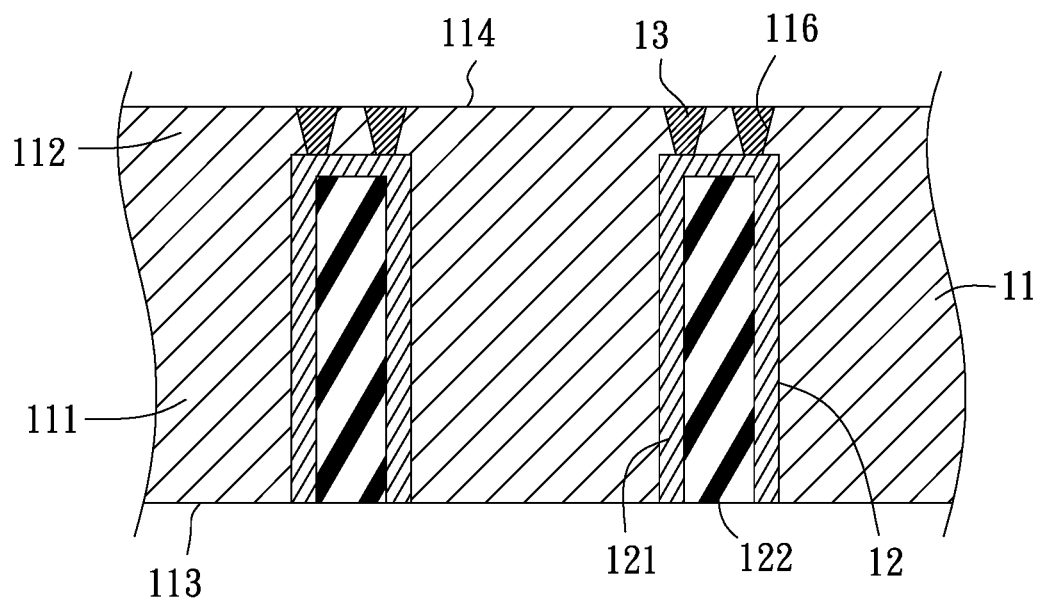
FIG. 6 is another schematic structural view for the manufacturing process of the core layer structure of the carrier board structure of the present disclosure shown in FIG. 5A.

Referring again to FIGS. 1, 2, and 6, after the manufacturing of the signal transmission portion 12, as shown in step S50, the embedded circuit layer 13 is formed inside the second side 112 of the core layer 11, so that the embedded circuit layer 13 is electrically connected to the signal transmission portion 12 inside the core layer 11 and is partially exposed on the second side 112 of the core layer 11, wherein a laser drilling method is employed to produce a plurality of a plurality of laser vias 116 on the second side 112 of the core layer 11, and then the embedded circuit layer 13 is disposed on the laser vias 116, and the embedded circuit layer 13 is electrically connected to the signal transmission portion 12 inside the core layer 11, and the embedded circuit layer 13 is partially exposed on the second side 112 of the core layer 11. In the embodiment, the embedded circuit layer 13 is produced by using the electroplating method, the embedded circuit layer 13 can be made of a conductive metal material, such as a copper material. The laser vias 116 may comprise a plurality of laser drilled holes, or comprise a plurality of laser drilled holes and a plurality of laser grooves, and during production of the laser vias 116, the signal transmission portion 12 can be used as a blocking protection structure so as to prevent the core layer 11 from being drilled through.

Figure 7:
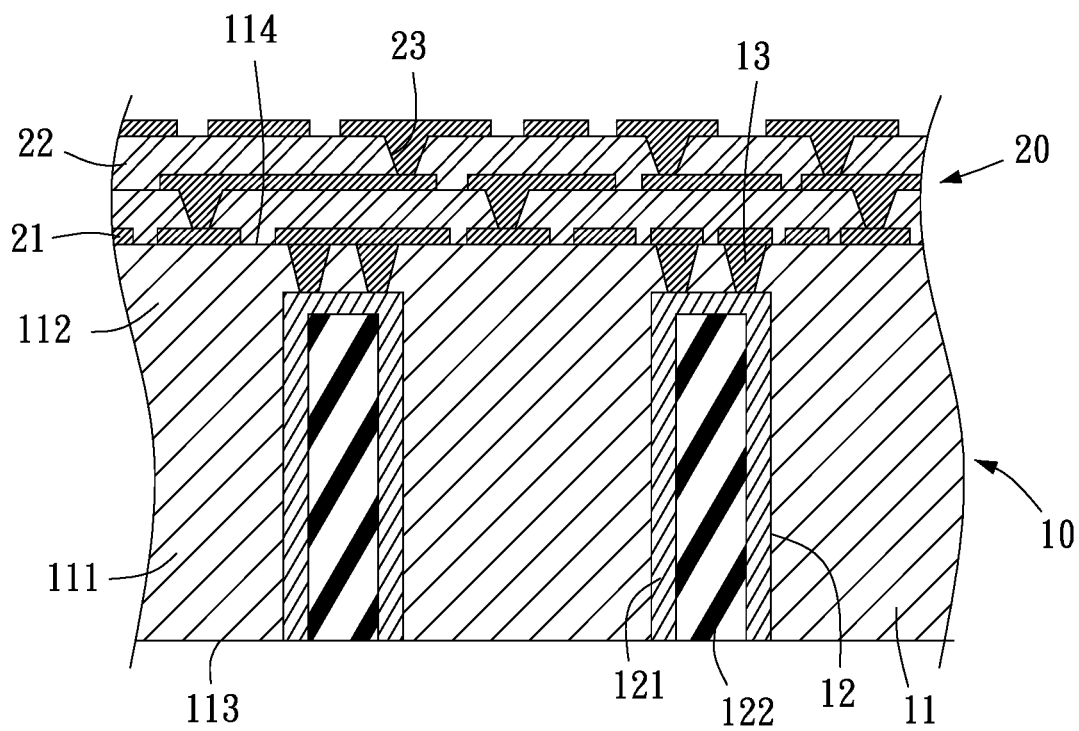
FIG. 7 is a schematic structural view of the manufacturing process of the first circuit build-up structure of the carrier board structure of the present disclosure as shown in FIG. 6.

Referring to FIGS. 1 and 2 again, after the production of the core layer structure 10, as shown in step S60, the first circuit build-up structure 20 is formed on the outer surface 114 of the second side 112 of the core layer 11 so that the first circuit build-up structure 20 is electrically connected to the embedded circuit layer 13. The first circuit build-up structure 20 comprises a plurality of layers in a stacked configuration, and each of the layers comprises a first circuit layer 21, a first dielectric layer 22, and a plurality of first blind vias 23. Referring to FIGS. 1 and 7, the first circuit layers 21 and the first dielectric layers 22 are disposed apart in a stacked configuration on the outer surface 114 of the second side 112 of the core layer 11, the first blind vias 23 are separately formed through the corresponding first dielectric layer 22, so as to make a portion of circuits of the first circuit layer 21 separated by the corresponding first dielectric layer 22 electrically connected through the corresponding first blind vias 23, so that the first circuit layers 21 are electrically connected to the embedded circuit layer 13. In the embodiment, the number of the layers of the first circuit build-up structure 20 can be designed according to the actual requirement and corresponding to the embedded circuit layer 13, and the positions of the first blind vias 23 can be produced according to the actual design. In a number of Figures of the embodiment, the structure of the first circuit build-up structure 20 is shown for the sake of illustration, and the present disclosure is not limited thereto.

A first one of the first circuit layers 21 is produced on the outer surface 114 of the second layer 112 of the core layer 11 of the core layer structure 10 by using the electroplating method or a coating method (if necessary, dry etching, wet etching, or other method can be used to remove the excess part of the first one of the first circuit layers 21), so that some of the circuit contacts in the first one of the first circuit layers 21 corresponding to the exposed part of the embedded circuit layer 13 are electrically connected. For example, the first one of the first circuit layers 21 may be made of a conductive metal material, such as a copper material. Since some of the circuit contacts in the first one of the first circuit layers 21 are not only connected to the circuit in the first one of the first circuit layers 21 on the same side, but also connected to the embedded circuit layer 13 provided in the core layer 11 so that double-sided circuit connection is provided inside and outside the second side 112 of the core layer 11. In this way, some of the circuit contacts in the first circuit layer 21 of the same size can be used for connection of an increased number of circuits, without the need to expand the area for the connection of the increased number of circuits. As such, the flexibility of the circuit layout can be enhanced. Since the connection of an increased number of circuits indicates that more signals can be transmitted, the performance can be improved also.

After the production of the first one of the first circuit layers 21 is completed, a first one of the first dielectric layers 22 is disposed. The disposing of the first one of the first dielectric layers 22 is to protect the first one of the first circuit layers 21, to provide support for a second one of the first circuit layers 21 to be disposed, and to isolate part of a circuit of the first one of the first circuit layers 21 from part of a circuit of the second one of the first circuit layers 21 so as to avoid short circuits due to incorrect connections. In the embodiment, the first one of the first dielectric layers 22 is produced on the first one of the first circuit layers 21 and the outer surface 114 of the second side 112 of the core layer 11 through a thin film manufacturing method (such as sputtering deposition/coating, deposition or coating), where the first dielectric layer 22 can be made of an oxide film of a dielectric material (such as silicon dioxide, etc.), an epoxy resin, or so on.

After the production of the first one of the first dielectric layers 22 is completed, a second one of the first circuit layers 21 is produced. Before the production of the second one of the first circuit layers 21, in order that part of the circuit of the second one of the first circuit layers 21 can be electrically connected to part of the circuit of the first one of the first circuit layers 21 so as to transmit signals, firstly the corresponding number and positions of first blind vias 23 are produced in the first one of the first dielectric layers 22 through the laser drilling method. The second one of the first circuit layers 21 is produced on the surface of the first one of the first dielectric layers 22 and the corresponding first blind vias 23 in the same way according to the manufacturing method of the first one of the first circuit layers described above.

According to the content of the manufacturing process of the first one of the first circuit layers 21, the second one of the first circuit layers 21, and the first one of the first dielectric layers 22, as described above, the subsequent ones of the first circuit layer 21 and the first dielectric layer 22 can be produced in a stacked configuration sequentially in the same way. After an outermost one of the first circuit layers 21 is produced, an outermost one of the first dielectric layers 22 can be provided on the outermost one of the first circuit layers 21 for protection and supporting subsequent components and structures. In order to electrically connect to the first circuit layer 21, corresponding first blind vias 23 are formed on the outermost one of the first dielectric layer 22. Alternatively, in an example, there is no need to additionally provide the first dielectric layer 22 so that the outermost one of the first circuit layers 21 can be used for being directly connected to the corresponding electronic components, wherein the drawings of the present disclosure reflect the latter one, but the present disclosure is not limited thereto.

After the production of the first circuit build-up structure 20 is completed, referring to FIGS. 1 and 2, as shown in step S70, the second circuit build-up structure 30 is formed on the outer surface 113 of the first side 111 of the core layer 11, so that the second circuit build-up structure 30 is electrically connected to the first circuit build-up structure 20 though the signal transmission portion 12 and the embedded circuit layer 13. In the embodiment, the second circuit build-up structure 30 comprises a plurality of layers in a stacked configuration. Each of the layers comprises a second circuit layer 31, a second dielectric layer 32, and a plurality of second blind via 33. The second circuit layers 31 and the second dielectric layers 32 are disposed apart sequentially in a stacked configuration. The second blind vias 33 are separately formed through the corresponding second dielectric layer 32, so as to make a portion of circuits of the second circuit layer 31 separated by the corresponding second dielectric layer 32 electrically connected through the corresponding second blind vias 33. In the embodiment, the number of the layers of the second circuit build-up structure 30 can be designed according to the actual requirement and corresponding to the first circuit build-up structure 20, and the positions of the second blind vias 33 can be produced according to the actual design. In a number of Figures of the embodiment, the structure of the second circuit build-up structure 30 is shown for the sake of illustration, and the present disclosure is not limited thereto.

Regarding the production method, the production method of the second circuit build-up structure 30 is the same as that of the first circuit build-up structure 20, except that the positions of disposition are different. For the first one of the second circuit layers 31, the first one of the second circuit layers 31 is produced on outer surface 113 of first side 111 of core layer 11 of the core layer structure 10 by using the electroplating method or a coating method (if necessary, dry etching, wet etching, or other method can be used to remove the excess part of the first one of the second circuit layers 31), so that some of the circuit contacts of the first one of the second circuit layers 31 are electrically connected to the signal transmission portion 12, and accordingly the first one of the second circuit layers 31 is electrically connected to the first one of the first circuit layers 21 of the first circuit build-up structure 20 through the signal transmission portion 12 and the embedded circuit layer 13. For example, the first one of the second circuit layer 31 may be made of a conductive metal material, such as a copper material.

After the production of the first one of second circuit layers 31 is completed, the first one of the second dielectric layers 32 is disposed. The disposing of the first one of the second dielectric layers 32 is to protect the first one of the second circuit layers 31, to provide support for a second one of the second circuit layers 31 to be disposed, and to isolate part of circuit of the first one of the second circuit layers 31 from part of a circuit of the second one of the second circuit layers 31 so as to avoid short circuits due to incorrect connections.

In the embodiment, the first one of second dielectric layers 32 is produced on the first one of the second circuit layers 31 and the outer surface 113 of the first side 111 of the core layer 11 through a thin film manufacturing method (such as sputtering deposition/coating, deposition or coating), where the second dielectric layer 32 can be made of an oxide film of a dielectric material (such as silicon dioxide, etc.), an epoxy resin, or so on.

After the production of the first one of the second dielectric layers 32 is completed, a second one of the second circuit layers 31 is then produced. Before the production of the second one of the second circuit layers 31, in order that part of the circuit of the second one of the second circuit layers 31 can be electrically connected to part of the circuit of the first one of the second circuit layers 31 so as to transmit signals. Firstly the corresponding number and positions of second blind vias 33 are produced in the first one of the second dielectric layers 32 through the laser drilling method. Then the second one of the second dielectric layers 32 is produced on the surface of the first one of the second dielectric layers 32 and in the corresponding second blind vias 33 in the same way according to the manufacturing method of the first one of the second circuit layers 31 described above.

According to the content of the manufacturing process of the first one of the second circuit layers 31, the second one of the second circuit layers 31, and the first one of the second dielectric layers 32, as described above, the subsequent ones of the second circuit layer 31 and the second dielectric layer 32 can be produced in a stacked configuration sequentially in the same way. After an outermost one of the second circuit layers 31 is produced, an outermost one of the second dielectric layers 32 can be provided on the outermost one of the second circuit layers 31 for protection and supporting subsequent components and structures. In order to electrically connect to the second circuit layer 31, corresponding second blind vias 33 can be formed on the outermost one of the second dielectric layer 32. Alternatively, in an example, there is no need to additionally provide the second dielectric layer 32 so that the outermost one of the second circuit layers 31 can be used for being directly connected to a corresponding circuit board, wherein the drawings of the present disclosure reflect the latter one, but the present disclosure is not limited thereto.

Therefore, according to the above examples, double-sided circuit connection can be provided by disposing the embedded circuit layer 13 in the core layer 11 of the core layer structure 10 and connecting the part of circuit contacts of the first circuit build-up structure 20 inside the core layer 11, so that the first circuit build-up structure 20 can connect more circuits without the need to design additional layers of structure, thereby not only improving the flexibility of circuit layout, but also reducing the volume of the circuit build-up structure. It can also solve the problem of the need to expand the area of some circuit contacts, thereby achieving the purposes of improving space utilization and circuit layout flexibility.

While the present disclosure has been described by means of specific embodiments, numerous modifications and variations could be made thereto by those skilled in the art without departing from the scope and spirit of the present disclosure set forth in the claims.

What is claimed is:

1. A carrier board structure with an increased core-layer trace area, comprising:
   a core layer structure comprising a core layer, a signal transmission portion, and an embedded circuit layer, the core layer having a first side and a second side opposite to each other, wherein the signal transmission portion is disposed inside the first side of the core layer and partially exposed on the first side of the core layer, the embedded circuit layer is disposed inside the second side of the core layer and electrically connected to the signal transmission portion inside the core layer, and is partially exposed on the second side of the core layer;
   a first circuit build-up structure, disposed on the second side of the core layer and electrically connected to the embedded circuit layer; and
   a second circuit build-up structure, disposed on the first side of the core layer, and electrically connected to the first circuit build-up structure through the signal transmission portion and the embedded circuit layer;
   wherein the embedded circuit layer comprises a plurality of vias inside the core layer, the signal transmission portion comprises a plurality of conductive members formed in a corresponding hole in a part of the core layer, and not connected with each other, each of the plurality of conductive members is electrically coupled between the embedded circuit layer and the second circuit build-up structure, and each of the plurality of conductive members is electrically coupled to the first circuit build-up structure through at least two corresponding vias of the plurality of vias of the embedded circuit layer; each of the plurality of conductive members is electrically coupled to the at least two corresponding vias of the plurality of vias to form signal transmission paths inside the core layer for signal transmission between the first circuit build-up structure and the second circuit build-up structure, an orthographic projection of the embedded circuit layer on the signal transmission portion is less than or equal to the signal transmission portion.

2. The carrier board structure with an increased core-layer trace area according to claim 1, wherein the signal transmission portion further comprises a plurality of insulation fillers, the insulation fillers are each disposed in the respective corresponding conductive members, the conductive members are partially exposed on the first side of the core layer and the insulation fillers are partially exposed on the first side of the core layer.

3. The carrier board structure with an increased core-layer trace area according to claim 1, wherein the conductive members are partially exposed on the first side of the core layer.

4. The carrier board structure with an increased core-layer trace area according to claim 1, wherein the first circuit build-up structure comprises in a stacked configuration a plurality of circuit build-up layers in a stacked configuration, each of the circuit build-up layers comprises a first circuit layer, a first dielectric layer, and a plurality of first blind vias; the first circuit layers and the first dielectric layers are disposed apart sequentially, the first blind vias are separately formed through the corresponding first dielectric layer, a portion of circuits of the first circuit layer separated by the corresponding first dielectric layer are electrically connected through the corresponding first blind vias, the first circuit layer of the first circuit build-up structure is electrically connected to the embedded circuit layer.

5. The carrier board structure with an increased core-layer trace area according to claim 1, wherein the second circuit build-up structure comprises a plurality of circuit build-up layers in a stacked configuration, each of the circuit build-up layers comprises a second circuit layer, a second dielectric layer, and a plurality of second blind vias; the second circuit layers and the first dielectric layers are disposed apart sequentially, the second blind vias are separately formed through the corresponding second dielectric layer, a portion of circuits of the second circuit layer separated by the corresponding second dielectric layer are electrically connected through the corresponding second blind vias, the second circuit layer of the second circuit build-up structure is electrically connected to the signal transmission portion.

* * * * *